United States Patent
Liu et al.

(10) Patent No.: US 12,396,238 B2
(45) Date of Patent: Aug. 19, 2025

(54) INSULATED GATE BIPOLAR TRANSISTOR DEVICE

(71) Applicant: SUZHOU ORIENTAL SEMICONDUCTOR CO., LTD., Jiangsu (CN)

(72) Inventors: Wei Liu, Jiangsu (CN); Minzhi Lin, Jiangsu (CN); Yuanlin Yuan, Jiangsu (CN); Rui Wang, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 0 days.

(21) Appl. No.: 18/017,047

(22) PCT Filed: Jun. 27, 2022

(86) PCT No.: PCT/CN2022/101534
§ 371 (c)(1),
(2) Date: Jan. 19, 2023

(87) PCT Pub. No.: WO2023/109080
PCT Pub. Date: Jun. 22, 2023

(65) Prior Publication Data
US 2024/0250137 A1    Jul. 25, 2024

(30) Foreign Application Priority Data
Dec. 15, 2021  (CN) .......................... 202111561080.4

(51) Int. Cl.
*H10D 12/00*  (2025.01)
*H10D 64/27*  (2025.01)

(52) U.S. Cl.
CPC ......... *H10D 64/281* (2025.01); *H10D 12/481* (2025.01)

(58) Field of Classification Search
CPC .... H10D 64/281; H10D 12/481; H10D 12/00; H10D 48/30; H10D 62/10; H10D 62/106;
(Continued)

(56) References Cited

U.S. PATENT DOCUMENTS

| 10,892,351 B2 * | 1/2021 | Tamaki | ............... H10D 12/481 |
| 2009/0294870 A1 * | 12/2009 | Arai | ...................... H10D 64/62 438/234 |

(Continued)

FOREIGN PATENT DOCUMENTS

| CN | 103681851 A | 3/2014 |
| CN | 105374866 A | 3/2016 |

(Continued)

OTHER PUBLICATIONS

PCT/CN2022/101534 International Search Report dated Sep. 7, 2022.

*Primary Examiner* — Sheikh Maruf
(74) *Attorney, Agent, or Firm* — Michael Best & Friedrich LLP

(57) ABSTRACT

An IGBT device includes a p-type collector region, an n-type semiconductor layer located above the p-type collector region, a plurality of gate trenches, shielded gates, gates, and a p-type body region located in the n-type semiconductor layer and between adjacent gate trenches. The gate trenches are located in the n-type semiconductor layer. A shielded gate is located in a lower part of a gate trench. A gate is located in an upper part of the gate trench. The gate, the shielded gate, and the n-type semiconductor layer are insulated and isolated from each other.

6 Claims, 1 Drawing Sheet

(58) Field of Classification Search
CPC .... H10D 62/127; H10D 62/17; H10D 62/393; H10D 64/117; H10D 64/27; H10D 84/645; H10D 62/124; H10D 64/311; H10D 12/491; H10D 12/038; H10D 84/641; Y02B 70/10
USPC ........................................................ 438/268
See application file for complete search history.

(56) References Cited

U.S. PATENT DOCUMENTS

| | | | |
|---|---|---|---|
| 2015/0108540 A1* | 4/2015 | Ogawa | H10D 62/393 257/139 |
| 2015/0263151 A1* | 9/2015 | Kawashiri | H01L 21/28 257/139 |
| 2017/0222009 A1* | 8/2017 | Hikasa | H10D 30/66 |
| 2017/0263714 A1* | 9/2017 | Ogura | H10D 12/481 |
| 2018/0083129 A1* | 3/2018 | Kitagawa | H10D 12/481 |
| 2018/0083131 A1* | 3/2018 | Tamaki | H10D 62/393 |
| 2018/0301538 A1* | 10/2018 | Ogura | H10D 12/411 |
| 2018/0358438 A1* | 12/2018 | Kanda | H10D 84/038 |
| 2019/0172935 A1* | 6/2019 | Sekiguchi | H10D 12/461 |
| 2020/0091323 A1* | 3/2020 | Iwakaji | H10D 64/517 |
| 2020/0212209 A1* | 7/2020 | Nagata | H10D 12/038 |

FOREIGN PATENT DOCUMENTS

| | | |
|---|---|---|
| CN | 106158973 A | 11/2016 |
| CN | 107887431 A | 4/2018 |
| CN | 110867443 A | 3/2020 |
| CN | 111048589 A | 4/2020 |
| JP | 2013065766 A | 4/2013 |

\* cited by examiner

INSULATED GATE BIPOLAR TRANSISTOR DEVICE

CROSS-REFERENCE TO RELATED APPLICATION(S)

This is a national stage application filed under 37 U.S.C. 371 based on International Patent Application No. PCT/CN2022/101534, filed Jun. 27, 2022, which claims priority to Chinese Patent Application No. 202111561080.4 filed with the China National Intellectual Property Administration (CNIPA) on Dec. 15, 2021, the disclosure of which is incorporated herein by reference in its entirety.

TECHNICAL FIELD

The present application relates to the technical field of semiconductor power devices, for example, an insulated gate bipolar transistor (IGBT) device.

BACKGROUND

An IGBT device is a device compounded by a metal oxide semiconductor (MOS) transistor and a bipolar transistor. An input pole of the IGBT device is the MOS transistor. An output pole of the IGBT device is a PNP transistor. Combining features of the two transistor devices, the IGBT device is equipped with both features (that is, a low driving power and a high on-off speed) of the MOS transistor, and features (that is, a low saturation voltage drop and a large capacity) of the bipolar transistor. For the IGBT device, due to a relatively low hole injection efficiency at a boundary between a p-type body region and an n-type drift region, a carrier concentration distribution is low, causing the saturation voltage drop to rise. When the IGBT device turns off, a large number of minority carriers are stored in the n-type drift region, resulting in a serious phenomenon of a tailing turning-off current of the IGBT device and leading to a large turning-off loss.

SUMMARY

The present application provides an IGBT device to reduce the turning-off loss of the IGBT device.

The present application provides an IGBT device. The IGBT device includes a p-type collector region, an n-type semiconductor layer located above the p-type collector region, a plurality of gate trenches, shielded gates, gates, and a p-type body region located in the n-type semiconductor layer and between adjacent gate trenches.

The gate trenches are located in the n-type semiconductor layer. A shielded gate is located in a lower part of a gate trench. A gate is located in an upper part of the gate trench. The gate, the shielded gate, and the n-type semiconductor layer are insulated and isolated from each other.

Each of partial shielded gates located in the gate trenches is externally connected to a gate voltage. The partial shielded gates are each defined as a first shielded gate. Each of shielded gates other than the partial shielded gates and located in the gate trenches is externally connected to an emitter electrode voltage. The shielded gates other than the partial shielded gates are each defined as a second shielded gate. The first shielded gate and the second shielded gate are disposed alternately.

The p-type body region includes a first p-type body region and a second p-type body region. The first p-type body region is located on a side of the p-type body region close to a first shielded gate adjacent to the p-type body region. The second p-type body region is located on a side of the p-type body region close to a second shielded gate adjacent to the p-type body region. An n-type emitter electrode region is disposed in each of the first p-type body region and the second p-type body region. The doping concentration of the first p-type body region is smaller than the doping concentration of the second p-type body region.

DETAILED DESCRIPTION

The solution of the present application is described hereinafter through specific implementations in conjunction with drawings in embodiments of the present application. The described embodiments are part of embodiments of the present application. To illustrate embodiments of the present application, in the schematic views illustrated in BRIEF DESCRIPTION OF DRAWINGS, thicknesses of layers and regions described in the present application are enlarged, and dimensions illustrated in the views do not represent the actual dimensions.

Figure 1:
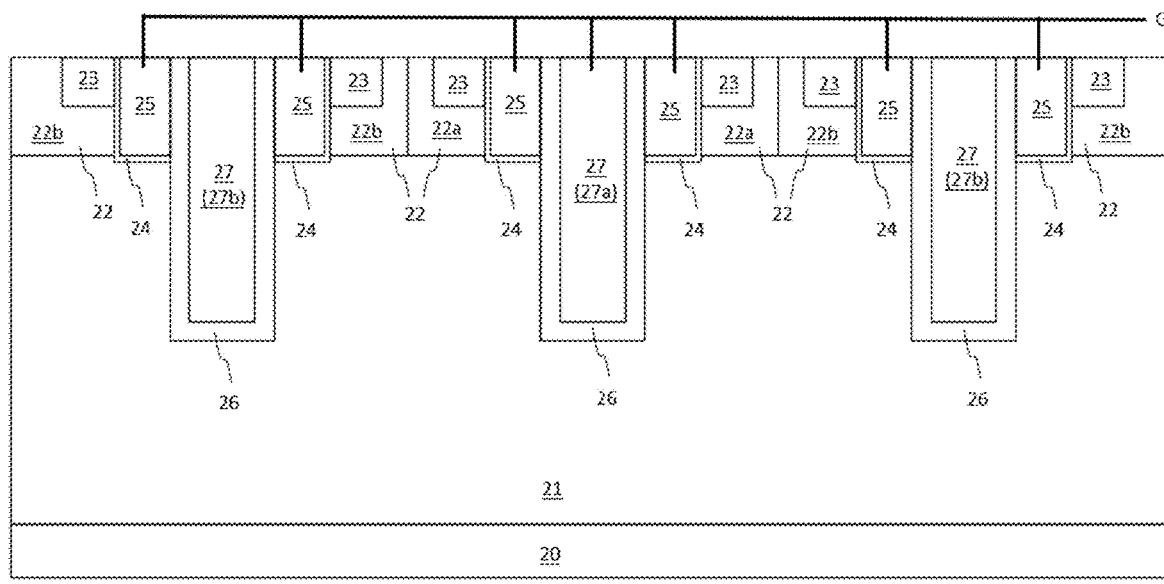
FIG. 1 is a section view of an IGBT device according to embodiments of the present application.

FIG. 1 is a section view of an IGBT device according to embodiments of the present application. As shown in FIG. 1, the IGBT device in the present application includes a p-type collector region 20 and an n-type semiconductor layer 21 located above the p-type collector region 20.

The IGBT device also includes a plurality of gate trenches, gates 25, and shielded gates 27. The gate trenches are located in the n-type semiconductor layer 21. A gate 25 is located in an upper part of a gate trench. A shielded gate 27 is located in a lower part of the gate trench. The shielded gate 27 may be merely located in the lower part of the gate trench so that the gate 25 and the shielded gate 27 are an upper and lower structure. Optionally, the shielded gate 27 may also be located in the lower part of the gate trench and extend upward into the upper part of the gate trench. FIG. 1 illustrates an example in which the shielded gate 27 is located in the lower part of the gate trench and extends upward into the upper part of the gate trench. Moreover, the width of the upper part of the gate trench may be greater than, equal to, or smaller than the width of the lower part of the gate trench. FIG. 1 illustrates that the width of the upper part of the gate trench is greater than the width of the lower part of the gate trench.

The gate 25, the shielded gate 27, and the n-type semiconductor layer 21 are insulated and isolated from each other. In FIG. 1, the gate 25 is insulated and isolated from the n-type semiconductor layer 21 through a gate dielectric layer 24, and the shielded gate 27 is isolated from the gate 25 and the n-type semiconductor layer 21 through a field oxide layer 26. In general, the thickness of the field oxide layer 26 is greater than the thickness of the gate dielectric layer 24.

For the IGBT device in the present application, each of partial shielded gates 27 located in the gate trenches is externally connected to a gate voltage G. The partial shielded gates 27 are each defined as a first shielded gate 27a. Each of shielded gates 27 other than the partial shielded gates 27 and located in the gate trenches is externally connected to an emitter electrode voltage (not shown). The shielded gates 27 other than the partial shielded gates 27 are each defined as a second shielded gate 27b. The first shielded gate 27a and the second shielded gate 27b are disposed alternately.

The IGBT device in the present application further includes a p-type body region 22 located in the n-type semiconductor layer 21 and between adjacent gate trenches. The p-type body region 22 includes a first p-type body region 22a and a second p-type body region 22b. The first p-type body region 22a is located on a side close to an adjacent first shielded gate 27a. The second p-type body region 22b is located on a side close to an adjacent second shielded gate 27b. An n-type emitter electrode region 23 is disposed in each of the first p-type body region 22a and the second p-type body region 22b. The doping concentration of the first p-type body region 22a is smaller than the doping concentration of the second p-type body region 22b.

Exemplarily, FIG. 1 merely illustrates 4 p-type body regions 22. Moreover, only for each of two p-type body regions 22 in the middle, a first p-type body region 22a and a second p-type body region 22b are illustrated. For each of two p-type body regions 22 on two sides, only a second p-type body region 22b is illustrated.

For the IGBT device in the present application, a threshold voltage Vth1 of a current channel in the first p-type body region 22a is smaller than a threshold voltage Vth2 of a current channel in the second p-type body region 22b. When a shielded gate 27 is externally connected to the gate voltage G, a gate 25 in the gate trench has a greater gate charge Qg1. When a shielded gate 27 is externally connected to the emitter electrode voltage, a gate 25 in the gate trench has a smaller gate charge Qg2. The arrangement in which the first p-type body region 22a is adjacent to the first shielded gate 27a and the second p-type body region 22b is adjacent to the second shielded gate 27b enables the small Vth1 to be combined with the great Qg1 and enables the great Vth2 to be combined with the small Qg2. Accordingly, in a process in which the IGBT device turns off from turning on, a current channel in a region where the great Vth2 is combined with the small Qg2 may turn off rapidly, while a current channel in a region where the small Vth1 is combined with the great Qg1 may turn off later. In this case, when the current channel in the region where the great Vth2 is combined with the small Qg2 just turns off, the current channel in the region where the small Vth1 is combined with the great Qg1 is still in the on state. With the reduction of the gate voltage Vg, the current channel in the region where the small Vth1 is combined with the great Qg1 turns off. Therefore, as an external manifestation of the IGBT device, a turning-off loss of the region where the small Vth1 is combined with the great Qg1 reduces a turning-off loss of the region where the great Vth2 is combined with the small Qg2, thereby reducing a turning-off loss of the IGBT device entirely.

Figure 2:
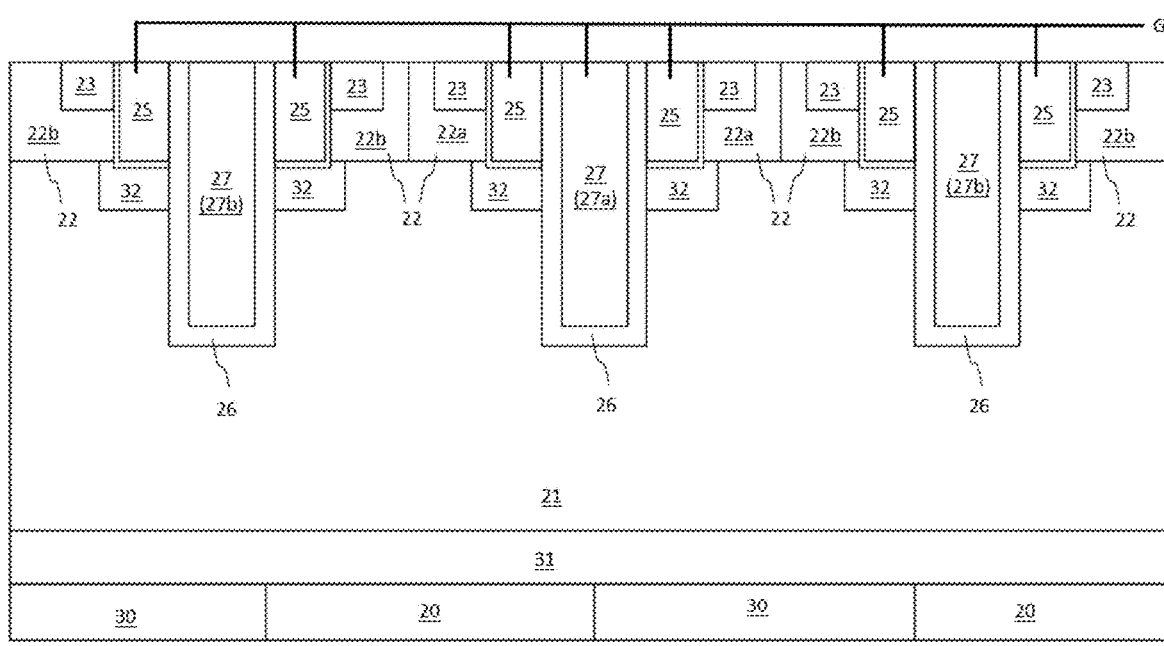
FIG. 2 is a section view of another IGBT device according to embodiments of the present application.

FIG. 2 is a section view of another IGBT device according to embodiments of the present application. As shown in FIG. 2, on the basis of the structure of the IGBT device shown in FIG. 1, the IGBT device in the present application may further include an n-type charge storage region 32 located in the n-type semiconductor layer 21. The n-type charge storage region 32 is located below the gates 25. In an embodiment, the IGBT device in the present application may further include n-type collector regions 30. The n-type collector regions 30 are located below the n-type semiconductor layer 21. Moreover, the n-type collector regions 30 and the p-type collector regions 20 are disposed alternately. Optionally, the IGBT device in the present application may further include an n-type field cutoff region 31. The n-type field cutoff region 31 is located between the p-type collector region 20 and the n-type semiconductor layer 21. The n-type charge storage region 32, the n-type field cutoff region 31, and the n-type collector region 30 are all known technology and are not described in detail in embodiments of the present application.

What is claimed is:

1. An insulated gate bipolar transistor (IGBT) device, comprising:
   a p-type collector region;
   an n-type semiconductor layer located above the p-type collector region;
   a plurality of gate trenches, shielded gates, and gates, wherein the plurality of gate trenches are located in the n-type semiconductor layer; each of the shielded gates is located in a lower part of one of the plurality of gate trenches; each of the gates is located in an upper part of one of the plurality of the gate trenches; and each of the gates, each of the shielded gates, and the n-type semiconductor layer are insulated and isolated from each other, wherein
   each of partial shielded gates among the shielded gates located in the plurality of gate trenches is externally connected to a gate voltage, the partial shielded gates are each defined as a first shielded gate, each of shielded gates other than the partial shielded gates and among the shielded gates located in the plurality of gate trenches is externally connected to an emitter electrode voltage, the shielded gates other than the partial shielded gates are each defined as a second shielded gate, and the first shielded gate and the second shielded gate are disposed alternately; and
   a p-type body region located in the n-type semiconductor layer and between adjacent gate trenches among the plurality of gate trenches, wherein the p-type body region comprises a first p-type body region and a second p-type body region, the first p-type body region is located on a side of the p-type body region close to a first shielded gate adjacent to the p-type body region, the second p-type body region is located on a side of the p-type body region close to a second shielded gate adjacent to the p-type body region, an n-type emitter electrode region is disposed in each of the first p-type body region and the second p-type body region, and a doping concentration of the first p-type body region is smaller than a doping concentration of the second p-type body region.

2. The IGBT device according to claim 1, wherein each of the shielded gates extends from the lower part of one of the gate trenches upward into the upper part of one of the gate trenches.

3. The IGBT device according to claim 2, wherein a width of the upper part of each of the gate trench is greater than a width of the lower part of the each of the gate trenches.

4. The IGBT device according to claim 3, further comprising n-type charge storage regions located in the n-type semiconductor layer, wherein each of the n-type charge storage regions is located below a respective one of the gates.

5. The IGBT device according to claim 1, further comprising n-type collector regions, wherein the IGBT device comprises a plurality of p-type collector regions, the n-type collector regions are located below the n-type semiconductor layer, and the n-type collector regions and the plurality of p-type collector regions are disposed alternately.

6. The IGBT device according to claim 1, further comprising an n-type field cutoff region, wherein the n-type field cutoff region is located between the p-type collector region and the n-type semiconductor layer.

\* \* \* \* \*